(12) United States Patent
Morris et al.

(10) Patent No.: US 10,651,182 B2
(45) Date of Patent: May 12, 2020

(54) THREE-DIMENSIONAL FERROELECTRIC NOR-TYPE MEMORY

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,663

(22) Filed: Sep. 28, 2018

(65) Prior Publication Data

US 2020/0105773 A1 Apr. 2, 2020

(51) Int. Cl.

| | |
|---|---|
| *H01L 27/11514* | (2017.01) |
| *H01L 27/11504* | (2017.01) |
| *H03K 19/20* | (2006.01) |
| *G11C 5/06* | (2006.01) |
| *G11C 11/22* | (2006.01) |
| *H01L 29/51* | (2006.01) |

(52) U.S. Cl.
CPC ......... *H01L 27/11514* (2013.01); *G11C 5/06* (2013.01); *G11C 11/2255* (2013.01); *G11C 11/2257* (2013.01); *H01L 27/11504* (2013.01); *H01L 29/516* (2013.01); *H03K 19/20* (2013.01)

(58) Field of Classification Search
CPC ......... H01L 27/11514; H01L 27/11504; H01L 29/516
See application file for complete search history.

(56) References Cited

U.S. PATENT DOCUMENTS

| | | | |
|---|---|---|---|
| 2016/0118404 A1 | 4/2016 | Haibing | |
| 2016/0322368 A1 | 11/2016 | Xiao et al. | |
| 2017/0069644 A1* | 3/2017 | Kikushima | ....... H01L 27/11556 |
| 2018/0122478 A1 | 5/2018 | Morris et al. | |
| 2018/0350837 A1* | 12/2018 | Yoo | ................... H01L 27/11514 |
| 2019/0326357 A1* | 10/2019 | Castro | ............... H01L 27/11514 |

FOREIGN PATENT DOCUMENTS

| | | |
|---|---|---|
| WO | 2018125024 A1 | 7/2018 |
| WO | WO 2018144957 | 8/2018 |

OTHER PUBLICATIONS

Cutress, "Intel and Micron to Dissolve 3D XPoint Partnership after 2019", AnandTech, Jul. 16, 2018, three pages, https://www.anandtech.com/show/13083/intel-and-micron-update-3d-xpoint-roadmap-combined-effort-2nd-gen-3rd-gen-separate.

Micheloni et al., "Architectural and Integration Options for 3D NAND Flash Memories", Computers, Aug. 10, 2017, pp. 1-19, vol. 6 Issue 3, MDPI AG, Basel, Switzerland.

Wikipedia, "Charge trap flash", May 30, 2018, nine pages, https://en.wikipedia.org/wiki/Charge_trap_flash.

Wikipedia, "Thin-film transistor", Jun. 28, 2018, three pages, https://en.wikipedia.org/wiki/Thin-film_transistor.

(Continued)

*Primary Examiner* — Raj R Gupta

(74) *Attorney, Agent, or Firm* — Trop, Pruner & Hu, P.C.

(57) ABSTRACT

An embodiment includes a three dimensional (3D) memory that includes a NOR logic gate, wherein the NOR logic gate includes a ferroelectric based transistor. Other embodiments are addressed herein.

22 Claims, 8 Drawing Sheets

(56) References Cited

OTHER PUBLICATIONS

Wikipedia, "System in package", Jun. 29, 2018, two pages, https://en.wikipedia.org/wiki/System_in_package.
Wikipedia, "Package on package", Jun. 24, 2018, four pages, https://en.wikipedia.org/wiki/Package_on_package.
Wikipedia, "Ferroelectric RAM", Aug. 21, 2018, six pages, https://en.wikipedia.org/wiki/Ferroelectric_RAM.
Wikipedia, "Ferroelectricity", Jul. 1, 2018, seven pages, https://en.wikipedia.org/wiki/Ferroelectricity.
Wikipedia, "Flash memory", Aug. 28, 2018, 23 pages, https://en.wikipedia.org/wiki/Flash_memory.
Das, "Intel's Embedded DRAM: New Era of Cache Memory", EE Times, Aug. 7, 2014, six pages, https://www.eetimes.com/author.asp?doc_id=1323410.
James, "The Confab—Semi Industry is Now Mature", Solid State Technology, Dec. 6, 2013, 49 pages, https://electroiq.com/chipworks_real_chips_blog/author/sdavis/page/3/.
James, "Recent Innovations in DRAM Manufacturing", Conference Paper, Aug. 2010, seven pages, Chipworks, Inc.
Tallis, "Micron 3D NAND Status Update", AnandTech, Feb. 12, 2016, four pages, https://www.anandtech.com/show/10028/micron-3d-nand-status-update.
Sheldon, "NAND flash memory basics: Comparing SLC, MLC and TLC NAND", Tech Target, Nov. 20, 2017, three pages, https://searchstorage.techtarget.com/feature/NAND-flash-memory-basics-Comparing-SLC-MLC-and-TLC-NAND.
Walker, "Samsung's 3D V-NAND Flash Product—The Spires of El Dorado?", 3D InCites, Aug. 12, 2014, two pages, https://www.3dincites.com/2014/08/samsungs-3d-vnand-flash-product-spires-el-dorado/.
Tai et al., "Photosensitivity Analysis of Low-Temperature Poly-Si Thin-Film Transistor Based on the Unit-Lux-Current", IEEE Transactions on Electron Devices, Jan. 2009, pp. 50-56, vol. 56, No. 1, Institute of Electrical and Electronics Engineers.
Alcorn, "WD's Big Advantage: BiCS3 64-Layer 3D NAND Coming This Year", Tom's Hardware, Jul. 26, 2016, three pages, https://www.tomshardware.com/news/wd-sandisk-bics3-64-layer-3d-nand,32328.html.
Polinksy, "Dynamic Random Access Memory—DRAM", Introduction to DRAM Technology, Aug. 28, 2001, 36 pages, Rochester Institute of Technology—Microelectronic Engineering.
European Patent Office, Extended Search Report dated Jan. 27, 2020 in European patent application No. 19183076.9-1203.

\* cited by examiner

THREE-DIMENSIONAL FERROELECTRIC NOR-TYPE MEMORY

TECHNICAL FIELD

Embodiments of the invention are in the field of semiconductor devices and, in particular, non-planar transistors.

BACKGROUND

Three dimensional (3D) NAND memory stacks memory cells into multiple layers to create a vertical layout. Each layer of memory may be based on, for example, a multi-level cell architecture. Within each layer of memory the cells are spaced out at greater distances from each other as opposed to conventional planar layouts for memory. This relatively greater spacing may result in good power efficiency and low electrical interference, but still achieves greater densities of memory due to the 3D stacking.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1A:
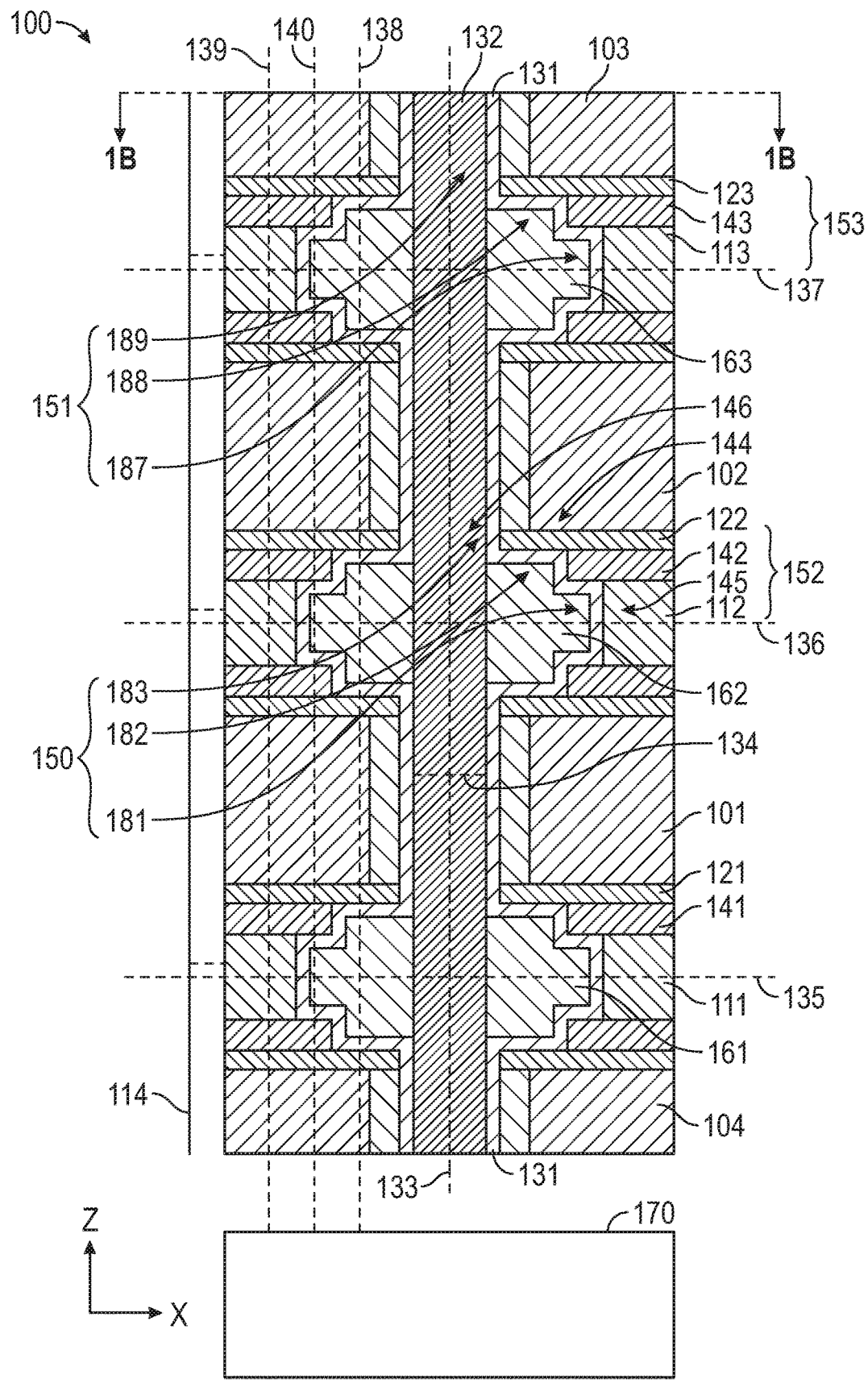
FIG. 1A includes a schematic representation of a vertical NOR gate-based memory.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As mentioned above, 3D NAND memory provides numerous advantages over conventional planar NAND memories. More specifically, Applicant has determined density is low for planar transistors (e.g., access transistors in memory) compared to 3D memory options, even if the planar process uses advanced lithography (e.g., pitch quadrupling or extreme ultraviolet lithography (EUV)). Regarding 3D NAND memory, the NAND arrangement includes a serial arrangement of transistors and has high memory cell density due to the vertical stacking of memory cells. However, even though 3D NAND has density improvements over planar memory cells, Applicant determined read currents for 3D NAND must pass through multiple transistors in series to read a single bit. As a result, read currents may be low and thus read performance may be low. In addition, Applicant determined a write operation requires applying voltage across a bit cell. Due in part to the serial connection between memory cells, writing to a single bit cell in the stack is difficult. Such write operations may require that multiple bit cells are reset together before a write operation is completed. This decreases random access performance of the memory array.

In contrast, embodiments described herein utilize ferroelectric FET (FE-FET) memory in a 3D NOR structure to provide random access to bit cells as well as a high density of bit cells. Such high-performance and high-density memory-based embodiments may be important in various contexts, such as cache or high-bandwidth memory for microprocessors. Such embodiments may be integrated into packages and/or chip stacking (see, e.g., FIG. 4) instead of or in addition to, for example, SRAM for high-capacity microprocessor caches. FE-FET based embodiments described herein may be integrated with logic due to low-voltage and high-endurance of the FE-FETs. Further, such embodiments improve bit cell density (as opposed to planar memory) by adoption of a 3D structure. In addition, because embodiments utilize a NOR structure (instead of a NAND structure) such embodiments have higher memory performance and are suitable for interoperation with microprocessors.

Before addressing FIG. 1A, ferroelectric memory is discussed. Ferroelectric memory refers to a memory technology employing ferroelectric materials. A ferroelectric material is a material that exhibits, over some range of temperatures, a spontaneous electric polarization (i.e., displacement of positive and negative charges from their original position), that can be reversed or reoriented by application of an electric field. Because the displacement of the charges in ferroelectric materials can be maintained for some time even in the absence of an electric field, such materials may be used to implement memory cells. Ferroelectric materials may include anti-ferroelectric materials. Embodiments using ferroelectric memories provide adequate non-volatility, short programming time, low power consumption, high endurance, and high speed writing. In addition, such embodiments may be manufactured using processes compatible with the standard complementary metal-oxide-semiconductor (CMOS) technology. A ferroelectric memory cell disclosed herein includes a ferroelectric FET (field effect transistor)(FE-FET). The ferroelectric material employed in the FE-FET may include, for example, materials exhibiting ferroelectric behavior at thin dimensions, such as hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), PZT BFO (which is a material that includes lead, zirconium, titanium, oxygen, bismuth, and iron)(e.g., $Pb(Zr_{0.52}Ti_{0.48})O_3/BiFeO_3$) and combinations thereof. Some embodiments include hafnium, zirconium, barium, titanium, and/or lead, and combinations thereof.

Figure 1B:
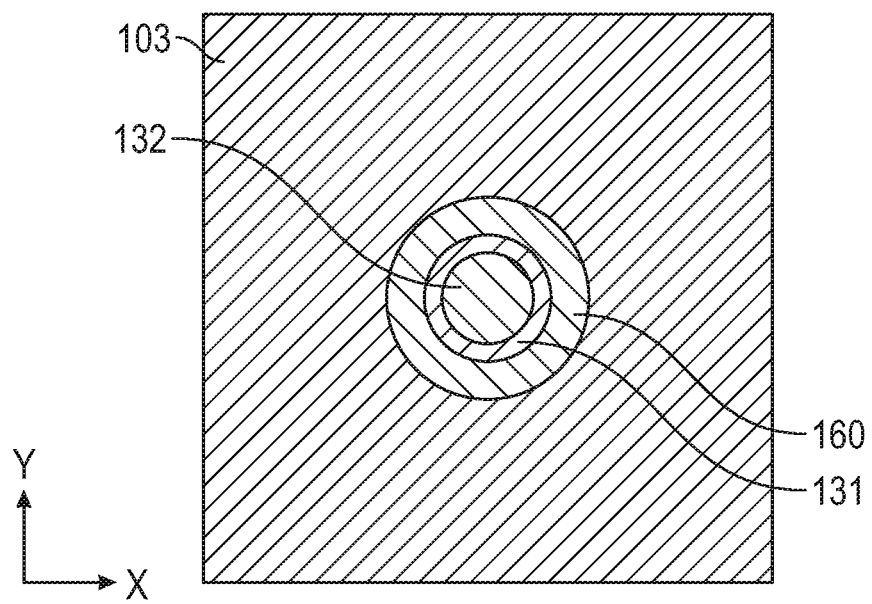
FIG. 1B includes a top view of a portion of the embodiment of FIG. 1A.

Now turning to the Figures, FIG. 1A provides a 3D NOR-type structure that integrates FE-FETs in parallel for high read current and high random-access performance. A single lithography forms an entire bit line of bit cells providing for a low cost manufacturing process. In FIG. 1B the X-Y plane is parallel to the wafer surface (e.g., see upper surface of substrate 170) and the Z-axis is normal to the wafer surface. The cross-section image shows three layers of bit cells for detail. The process may be used for any number of bit cells (e.g., 64).

FIG. 1A includes a memory 100 that includes a substrate 170. This substrate may include a silicon wafer having front end devices included therein. The substrate may be a package substrate whereby die are coupled above and/or below the substrate. Memory 100 includes first, second, and third word lines 101, 102, 103. However, other word lines (e.g., word line 104) may be included in the same layer as any of lines 101, 102, 103 and/or in layers above or below the layers including lines 101, 102, 103. Word lines may include, for example, tungsten, copper, aluminum, tantalum, titanium, cobalt, and combinations thereof Memory 100 further includes first, second, and third layers 111, 112, 113. Layers 111, 112, 113 each include a metal, such as tungsten. Layers 111, 112, 113 may provide source lines coupled to a common source line 114. Common source line 114 may be coupled to, for example, Vss or some other power supply. Layer 111 is between the substrate 170 and the first word line 101, the second layer 112 is between the first and second word lines 101, 102, and the third layer 113 is between the second and third word lines 102, 103.

Memory 100 includes first, second, and third portions 121, 122, 123 of a material. The material may include a ferroelectric material. The ferroelectric material includes oxygen as well as at least one of hafnium, zirconium, barium, titanium, lead, and combinations thereof. In an embodiment the ferroelectric material includes lead, zirconium, and titanium. The first portion 121 of the material is between the first word line 101 and the first layer 111. The second portion 122 of the material is between the second word line 102 and the second layer 112. The third portion 123 of the material is between the third word line 103 and the third layer 113.

A monolithic semiconductor layer 131 directly contacts the first, second, and third portions 121, 122, 123 of the material. The semiconductor layer may include, for example, polysilicon, a III-V semiconductor, silicon, a IV semiconductor, or backend low-temperature transitory material such as IGZO. By "monolithic", layer 131 is a continuous semiconductor layer that includes a portion that extends, uninterrupted, from, for example, the first layer 111 to the third word line 103.

Bit line 132 may include tungsten, copper, aluminum, tantalum, titanium, cobalt, and combinations thereof. Bit line 132 includes a long axis 133 and a short axis 134. A first plane 135, parallel to the short axis 134, intersects the first layer 111, the semiconductor layer 131, and the bit line 132. A second plane 136, parallel to the short axis 134, intersects the second layer 112, the semiconductor layer 131, and the bit line 132. A third plane 137, parallel to the short axis 134, intersects the third layer 113, the semiconductor layer 131, and the bit line 132.

A first axis 138 is parallel to the long axis 133. Axis 138 intersects the first, second, and third word lines 101, 102, 103 and the first, second, and third portions 121, 122, 123 of the ferroelectric material. A second axis 139, parallel to the long axis 133, intersects the first, second, and third layers 111, 112, 113. The axis 138 does not intersect any of the first, second, or third layers. In an embodiment, axis 139 intersects the first, second, and third word lines 101, 102, 103 and the first, second, and third portions 121, 122, 123 of the ferroelectric material. In an embodiment axis 138 intersects the semiconductor layer 131.

Memory 100 includes a first insulator material 141 between the first layer 111 and the first portion 121 of the material. The first insulator material includes at least one of oxygen or nitrogen. Memory 100 includes a second insulator material 142 between the second layer 112 and the second portion 122 of the material. The second insulator material includes at least one of oxygen or nitrogen. Memory 100 includes a third insulator material 143 between the third layer 113 and the third portion 123 of the material. The third insulator material includes at least one of oxygen or nitrogen.

In an embodiment a third axis 140, parallel to the long axis 133, intersects: (a) the first, second, and third word lines 101, 102, 103, (b) the first, second, and third portions 121, 122, 123 of the ferroelectric material, and (c) the first, second, and third insulator materials 141, 142, 143. The axis 140 does not intersect any of the first, second, or third layers 111, 112, 113. In an embodiment the axis 140 intersects the semiconductor layer 131.

FIG. 1A displays a portion of a NOR logic gate. The NOR logic gate includes the first, second, and third portions 121, 122, 123 of the ferroelectric material and the semiconductor layer 131. For instance, memory 100 includes a switching device (e.g., Fe-FET) 150 that includes a source 181 (which couples to common source line 114 and source line 112), a channel 182, and a drain 183 (which couples to bit line 132). Each of the source, channel, and drain are included in the semiconductor layer 131. A gate 144 corresponding to channel 142 includes a portion of word line 102. A source contact 145 corresponding to the source 141 includes a portion of the layer 112. A drain contact 146 corresponding to the drain 143 includes a portion of the bit line 132.

Figure 1C:
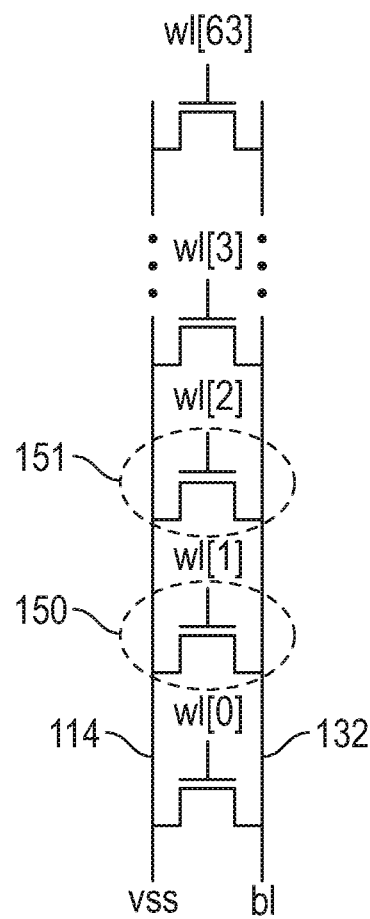
FIG. 1C includes a circuit representation of a portion of an embodiment of a vertical NOR gate-based memory.

The NOR gate of memory 100 further includes a switching device 151 that includes a source 187, a channel 188, and a drain 189 all included in semiconductor layer 131. An additional gate corresponding to channel 148 includes a portion of word line 103. A source contact corresponding to the source 147 includes a portion of layer 113. A drain contact corresponding to the drain 149 includes a portion of the bit line 132. Considering switching devices 150, 151 are circular in the X-Y plane, axis 138 intersects the switching devices 150, 151. The switching devices 150, 151 are coupled to the bit line 132 in parallel with each other to form the NOR gate. See also FIG. 1C.

Memory 100 includes first and second memory cells 152, 153, wherein: the first memory cell 152 includes the switching device 150; the second memory cell 153 does not include the first switching device 151; the first and second memory cells are included in random access memory (RAM) 100; and the first memory cell 152 is addressable independently of the second memory cell 153 due to the parallel nature of how the cells are accessed via the NOR gate architecture. Memory 100 includes insulator material 161 including at least one of oxygen or nitrogen, the insulator material 161 being between the word line 101 and the substrate 170 and between the semiconductor layer 131 and the bit line 132. Memory 100 includes insulator material 162 including at least one of oxygen or nitrogen, the insulator material 162 being between the first and second word lines 101, 102 and being between the semiconductor layer 131 and the bit line 132. Memory 100 includes insulator material 163 including at least one of oxygen or nitrogen, the insulator material 163 being between the second and third word lines 102, 103 and being between the semiconductor layer 131 and the bit line 132.

In an embodiment, semiconductor layer 131 includes a continuous portion of the semiconductor layer that extends, uninterrupted, from the first layer 111 to the third word line 103. As will be explained below with regard to FIG. 3 (see block 308), this monolithic nature of layer 131 is due to the deposition (e.g., atomic layer deposition (ALD)) of the layer within a void of the stack.

Thus, memory 100 provides a high-density memory made with a monolithic 3D process. The process forms NOR-type bit cells and uses ferroelectric materials. Etch selectivity is used to recess source, spacer, and gate materials in a hole. Such an embodiment is a process for cost-effective fabrication of memory that is both dense and has high-performance. Due to the 3D integration scheme, bit cells may be formed at a density that far exceeds the density of lithographically defined planar features. Such a memory may be suitable for last-level microprocessor caches (or other level caches) and the like. In an embodiment a process uses single lithography (e.g., element 302 of FIG. 3) and recess steps (e.g., element 307 of FIG. 3).

Figure 2:
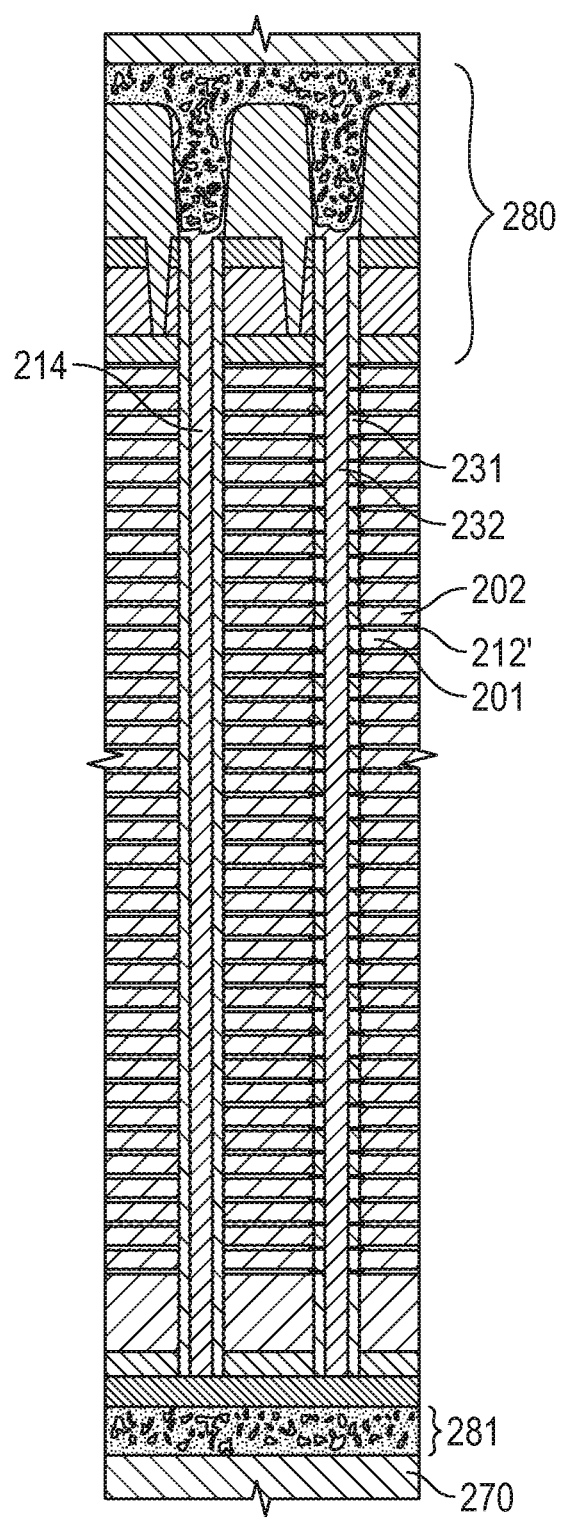
FIG. 2 includes a schematic representation of an image of an embodiment of a vertical NOR gate-based memory.

FIG. 2 includes a representation of an image of memory 100 of FIG. 1A. Common source line 214, bit line 232, and semiconductor layer 231 are deployed vertically with word lines 201, 202 deployed horizontally. Source line 212' and other elements (e.g., ferroelectric material and insulator material) are between the word lines. Metal interconnect levels 280 are above the memory and memory controller circuitry 281 (e.g., word line driver, x and/or y decoders, sense amplifiers, multiplexor, and generally addressing circuitry to address memory cells) is below the array and located in the frontend of substrate 270.

Figure 3:
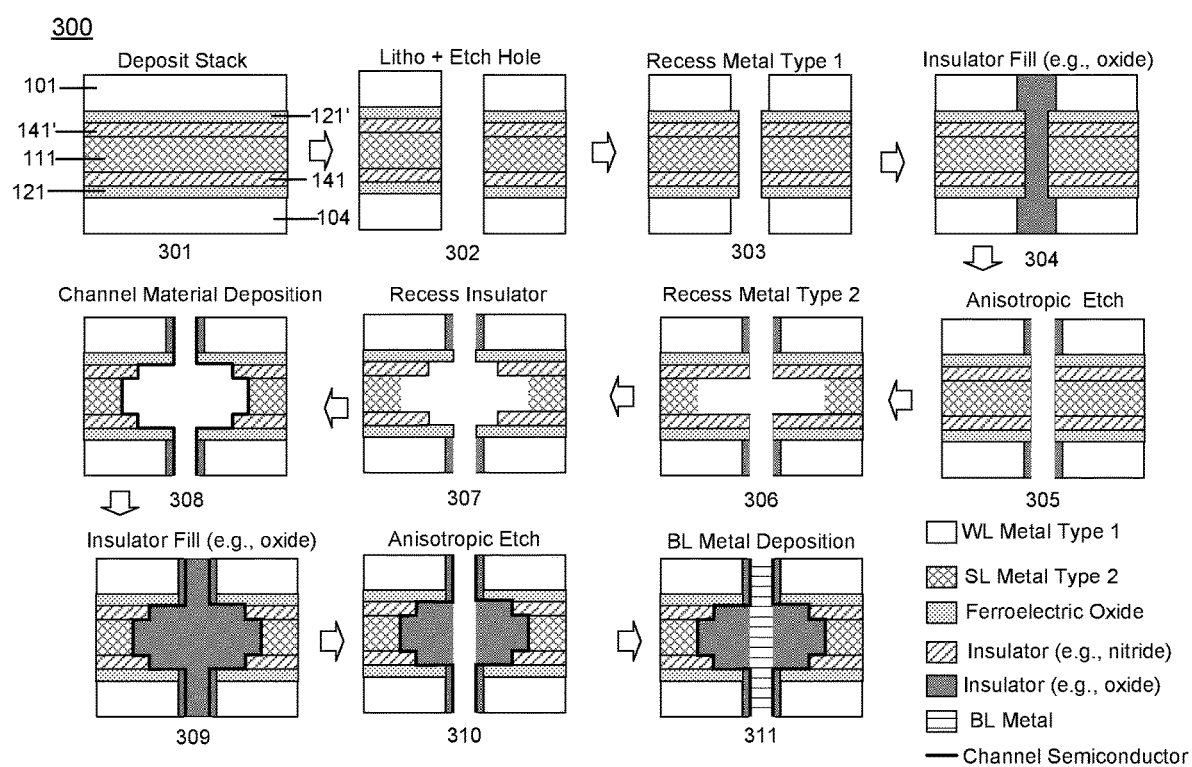
FIG. 3 includes an embodiment of a process flow for forming a vertical NOR gate-based memory.

FIG. 3 includes a process flow 300 for forming a 3D Fe-FET NOR memory. In block 301 a planar stack is deposited consisting of a word line metal 104, a ferroelectric material 121, an insulator material 141, a source line metal 111, an insulator material 141', a ferroelectric material 121', and a word line metal 101. This sequence of depositions is repeated multiple times to form additional bits (or what will become bits with additional processing) on the bit line. In an embodiment the word line metal (referred to as "Type 1" metal in FIG. 3 although the material may be a conductor and not necessarily a metal) and the source line metal (referred to as "Type 2" metal in FIG. 3 although the material may be a conductor and not necessarily a metal) are chosen to have different etch selectivity and thus are described as being different types of metal. Examples of metal for either of the word and source lines include, copper, tungsten, tantalum. More generally the word line and source line may be conductors such as doped poly or amorphous silicon. The selection of word line and source line conductors depends on the specific etch process used. In an embodiment the ferroelectric oxide may be hafnium oxide doped with silicon, zirconium, and/or yttrium.

In block 302, a hole is lithographically defined on the stack or hard mask and etched through the entire bit cell stack. In block 303 an isotropic etch selective to the word line conductor is used. This recesses the word line conductor but not the source line conductor due to etch selectivity selective to the word line metal. In block 304 an oxide is formed on the word line by oxide deposition followed by an anisotropic etch (block 305). Alternately, electrical isolation material may be formed on the word line by selective deposition. Alternatively, electrical isolation material maybe formed on the word line by oxidation if the word line material is a semiconductor material such as polysilicon. In block 306 the source line conductor is recessed by an etch that is selective to the source line conductor material. In block 307 the isolation layer between the source line and the word line is recessed. More generally the isolation layer may be a nitride, oxide, or carbide to achieve desired etch characteristics. In block 308 a channel material is deposited in the hole. The channel material may include polysilicon, a III-V semiconductor, silicon, a IV semiconductor, backend low-temperature transitory material such as IGZO, or combinations thereof. The channel material may be deposited by ALD thereby forming the "monolithic" semiconductor layer mentioned above.

In block 309 an isolation material is formed on the channel material over the source and channel regions of the device. This may be formed by first filling the hole with an oxide that will fill the crevice formed by the recess source terminal. The fill process may be sufficient to avoid pinch-off or shadowing. The hole may be large (e.g., more than 100 nm in diameter) without excessive density cost due to the vertical integration of parallel FE-FET. In block 310 the drain terminals of the FE-FET are revealed (see newly exposed portions of semiconductor layer). An anisotropic etch followed by an oxide-selective etch/clean may be used. In block 311 the bit line metal may be deposited in the hole. ALD may be used. The bit line metal connects the revealed FE-FET drains together.

Figure 4:
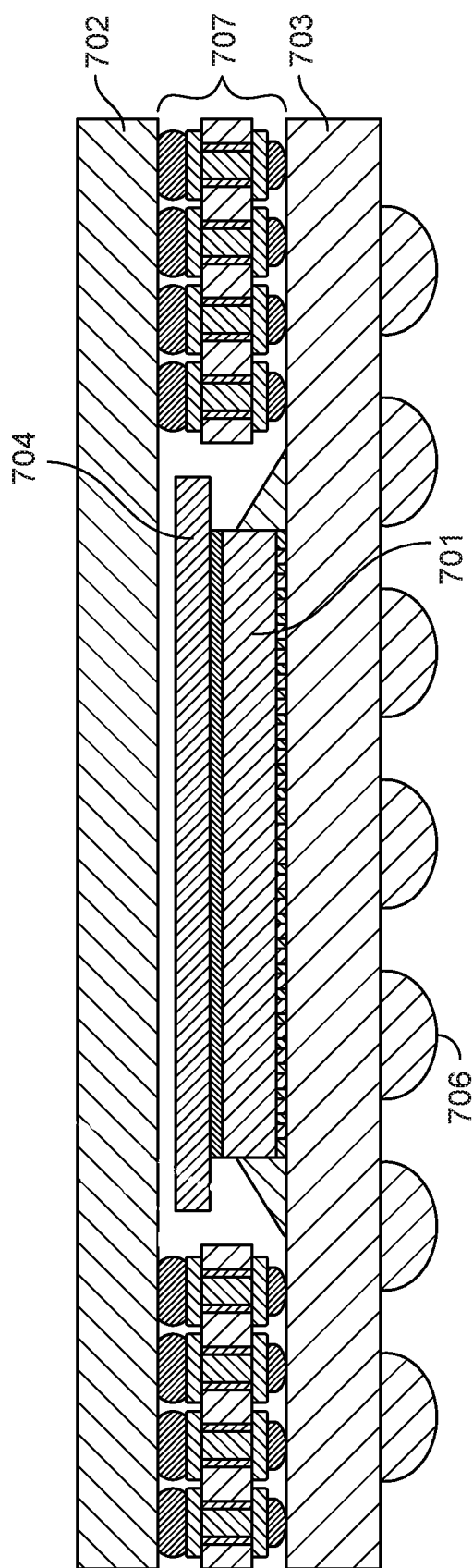
FIGS. 4, 5, 6, 7 include systems that include embodiments.

FIG. 4 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 4, die 701 includes the vertical memory of FIGS. 1-2. In another embodiment die 702 includes the vertical memory of FIGS. 1-2. In an embodiment die 701 includes the vertical memory of FIGS. 1-2 and die 702 includes the vertical memory of FIGS. 1-2.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 4 depicts an integrated circuit, a memory, and a package that includes the integrated circuit and the memory. The integrated circuit and/or memory includes the vertical memory of FIGS. 1-2. For example, the circuit may be a processor with vertical NOR memory located in the processor. For example, the circuit may be a field programmable gate array (FPGA) with vertical NOR memory located in the FPGA. In other embodiments, the memory (in addition to the integrated circuit or instead of the integrated circuit) includes any of the vertical NOR memory of FIGS. 1-2.

Figure 5:
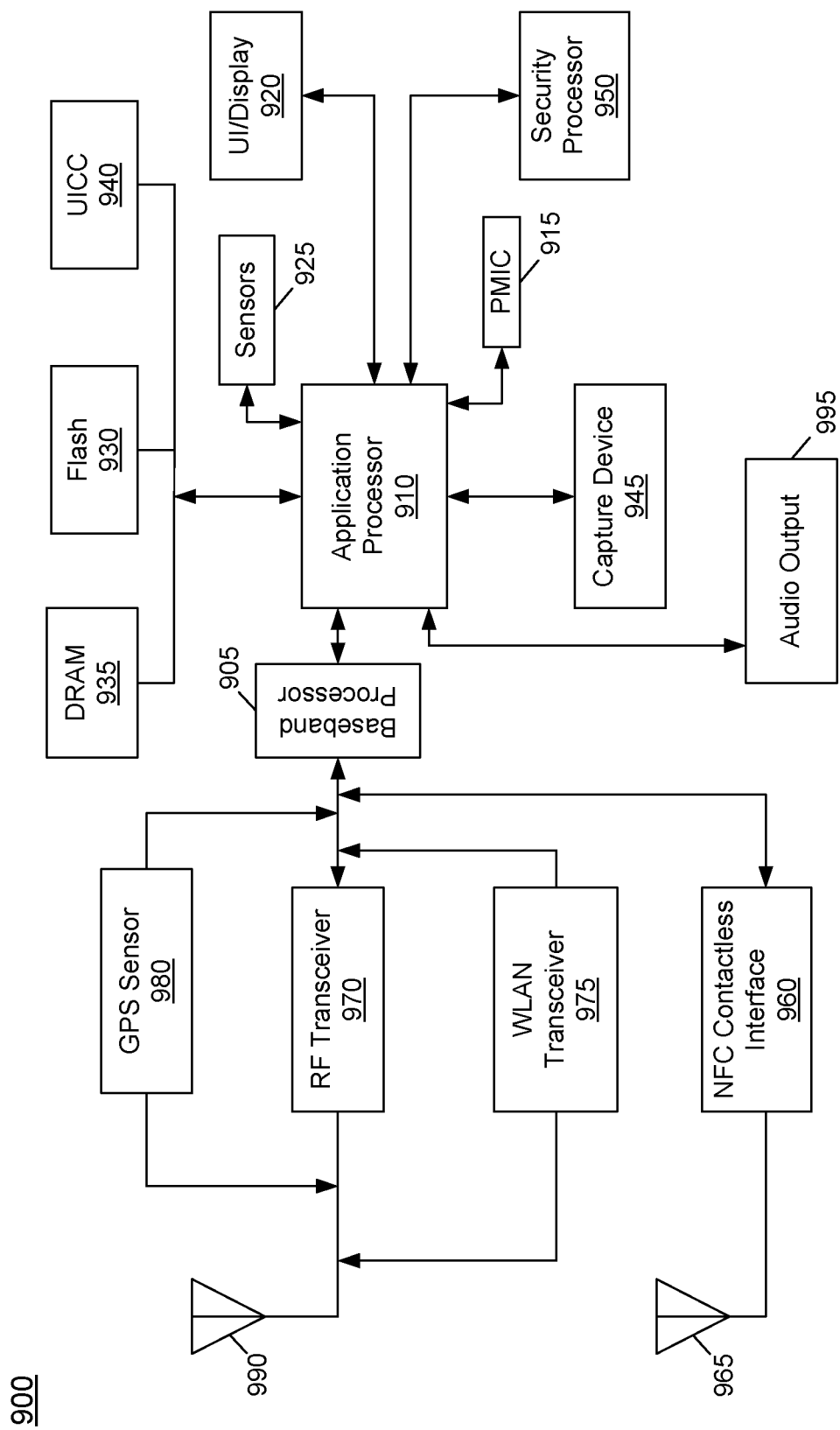

Referring now to FIG. 5, shown is a block diagram of an example system with which embodiments can be used. As seen, system 900 may be a smartphone or other wireless communicator or any other Internet of Things (IoT) device. A baseband processor 905 (which may include any vertical memory described herein) is configured to perform various signal processing with regard to communication signals to be transmitted from or received by the system. In turn, baseband processor 905 is coupled to an application processor 910, which may be a main CPU (which may include any vertical memory described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory (which may include any vertical memory described herein), namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 (which may include any vertical memory described herein) comprises a subscriber identity module, which in some embodiments includes a secure storage to store secure user information. System 900 may further include a security processor 950 (e.g., Trusted Platform Module (TPM)) (which may include any vertical memory described herein) that may couple to application processor 910. A plurality of sensors 925, including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include any vertical memory described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
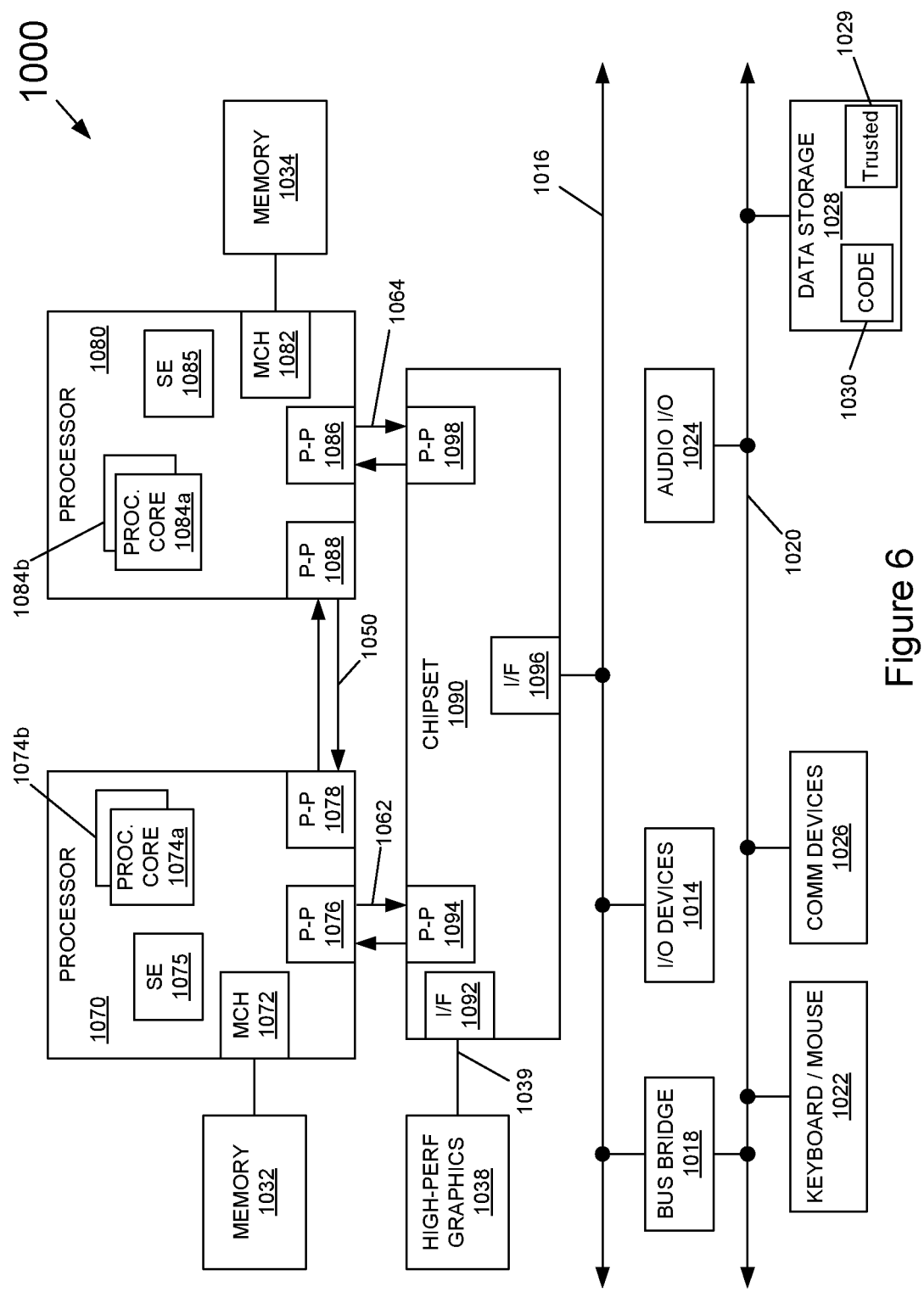

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include any vertical memory described herein) such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034 (which may include any vertical memory described herein), which may be portions of main memory (e.g., a DRAM) locally attached to the respective processors. First processor 1070 and second processor 1080 may be coupled to a chipset 1090 via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include any vertical memory described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 7:
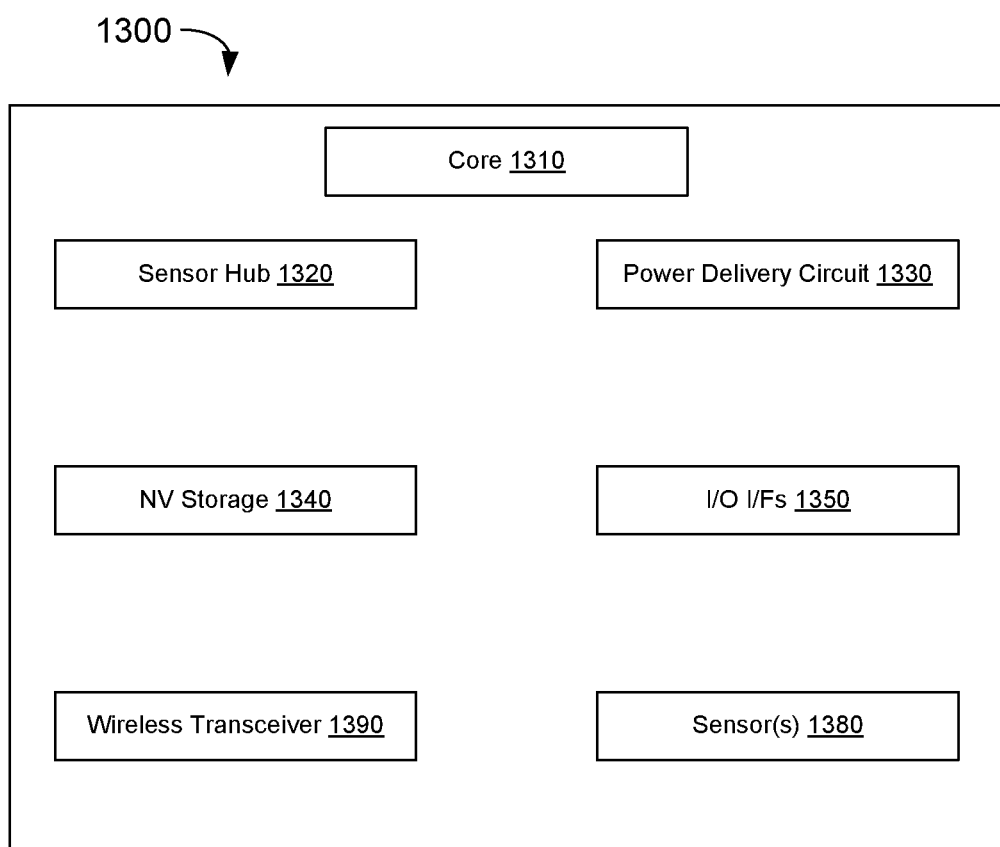

Referring now to FIG. 7, embodiments may be used in environments where IoT devices may include wearable devices or other small form factor IoT devices. Shown is a block diagram of a wearable module 1300 in accordance with another embodiment. In one particular implementation, module 1300 (which may include any vertical memory described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 (which may include any vertical memory described herein) is present, along with a non-volatile storage 1340 (which may include any vertical memory described herein). In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

A system comprising: a substrate; a first word line, including a metal, on the substrate; a second word line, including the metal, on the first word line; a third word line, including the metal, on the second word line; a first layer, including an additional metal, between the substrate and the first word line; a second layer, including the additional metal, between the first and second word lines; a third layer, including the additional metal, between the second and third word lines; a first material between the first word line and the first layer, the first material including lead, zirconium, and titanium; a second material between the second word line and the second layer, the second material including lead, zirconium, and titanium; a third material between the third word line and the third layer, the third material including lead, zirconium, and titanium; a monolithic semiconductor layer directly contacting the first, second, and materials; a bit line having a long axis and a short axis; wherein (a) a first plane, parallel to the short axis, intersects the first layer, the semiconductor layer, and the bit line; (b) a second plane, parallel to the short axis, intersects the second layer, the semiconductor layer, and the bit line; and (c) a third plane, parallel to the short axis, intersects the third layer, the semiconductor layer, and the bit line.

Example 2

The system of claim 1 comprising a NOR logic gate, wherein the NOR logic gate includes the first, second, and third materials and the semiconductor layer.

Example 3

The system of claim 2 comprising: a first axis that is parallel to the long axis, the first axis intersecting the bit line; a second axis that is parallel to the long axis, the second axis intersecting the first, second, and third word lines and the first, second, and third materials; a third axis, parallel to the long axis, that intersects the first, second, and third layers; wherein the second axis does not intersect any of the first, second, or third layers.

Example 4

The system of claim 3 wherein the third axis intersects the first, second, and third word lines and the first, second, and third materials.

Example 5

The system of claim 4 wherein: the second axis intersects the semiconductor layer; the third axis intersects the semiconductor layer.

Example 6

The system of claim 4 comprising a first switching device, wherein: the first switching device includes a first source, a first channel, and a first drain; the first source includes the semiconductor layer; the first channel includes the semiconductor layer; the first drain includes the semiconductor layer; a gate corresponding to the channel includes a portion of the first word line; a source contact corresponding to the first source includes a portion of the first layer; a drain contact corresponding to the first drain includes a portion of the bit line.

Example 7

The system of claim 6 comprising first and second memory cells, wherein: the first memory cell includes the first switching device; the second memory cell does not include the first switching device; the first and second memory cells are included in random access memory (RAM); the first memory cell is accessible independently of the second memory cell.

Example 8

The system of claim 6 comprising: a first insulator material between the first word line and the first material, the first insulator material including at least one of oxygen or nitrogen; a second insulator material between the second word line and the second material, the second insulator material including at least one of oxygen or nitrogen; and a third insulator material between the third word line and the third material, the third insulator material including at least one of oxygen or nitrogen.

Example 9

The system of claim 8 comprising a fourth axis, parallel to the first axis, wherein: the fourth axis intersects the first, second, and third word lines, the first, second, and third materials; and the first, second, and third insulator materials; the fourth axis does not intersect any of the first, second, or third layers.

Example 10

The system of claim 9 wherein the fourth axis intersects the semiconductor layer.

Example 11

The system of claim 10 comprising: an additional first insulator material including at least one of oxygen or nitrogen, the additional first insulator material: (a)(i) being between the first word line and the substrate, and (a)(ii) being between the semiconductor layer and the bit line; an additional second insulator material including at least one of oxygen or nitrogen, the additional second insulator material: (a)(i) being between the first and second word lines, and (a)(ii) being between the semiconductor layer and the bit line; an additional third insulator material including at least one of oxygen or nitrogen, the additional third insulator material: (a)(i) being between the second and third word lines, and (a)(ii) being between the semiconductor layer and the bit line.

Example 12

The system of claim 2 comprising a processor, wherein: the substrate includes an interconnect; the interconnect couples the processor to the NOR logic gate.

Example 13

The system of claim 2 comprising a processor, wherein: the substrate includes a switching device; and the processor includes the switching device.

Example 14

The system of claim 2 comprising: a processor; a processor memory cache corresponding to the processor; wherein the processor memory cache includes the NOR logic gate.

Example 15

The system of claim 2 comprising random access memory (RAM) that includes the NOR logic gate.

Example 16

The system of claim 2 wherein: the metal includes a first metal; the additional metal includes a second metal that is not the same as the first metal.

Example 17

A system comprising: first, second, and third word lines on a substrate; first, second, and third layers including a metal, wherein the first layer is between the substrate and the first word line, the second layer is between the first and second word lines; and the third layer is between the second and third word lines; first, second, and third materials including a ferroelectric material, wherein the first material is between the first word line and the first layer, the second material is between the second word line and the second layer, and the third material is between the third word line and the third layer; a continuous semiconductor layer directly contacting the first, second, and third materials; a bit line having a long axis and a short axis; wherein (a) a first plane, parallel to the short axis, intersects the first layer, the bit line, and the semiconductor layer; (b) a second plane, parallel to the long axis, intersects the first, second, and third word lines and the first, second, and third materials but does not intersect any of the first, second, or third layers; and (c) a third plane, parallel to the long axis, intersects the first, second, and third layers.

Example 18

The system of claim 17 comprising a NOR logic gate, wherein the NOR logic gate includes the first, second, and third materials and the semiconductor layer.

Example 19

The system of claim 17 wherein: the ferroelectric material includes oxygen; the ferroelectric material includes at least one of hafnium, zirconium, barium, titanium, lead, and combinations thereof.

Example 20

A method comprising: providing a substrate; forming a stack on the substrate, the stack comprising: (a)(i) first, second, and third layers including a first metal, (a)(ii) additional first, second, and third layers including a second metal, wherein the additional first layer is between the substrate and the first layer, the additional second layer is between the first and second layers; and the additional third layer is between the second and third layers; (a)(iii) first, second, and third materials including a ferroelectric material, wherein the first material is between the first layer and the additional first layer, the second material is between the second layer and the additional second layer, and the third material is between the third layer and the additional third layer; removing portions of: (b)(i) the first, second, and third layers, (b)(ii) the additional first, second, and third layers, and the (b)(iii) first, second, and third materials; removing additional portions of the additional first, second, and third layers; in response to removing additional portions of the additional first, second, and third layers, forming a continuous semiconductor layer within the first void and directly contacting the first, second, and third materials; forming an insulator material that directly contacts the semiconductor layer; removing a portion of the insulator material; in response to removing a portion of the insulator material, forming a metal line within the second void.

Example 21

The method of claim 20 comprising: forming first, second, and third word lines from the first, second, and third layers; forming a bit line from the metal line within the second void.

Example 22

The method of claim 21 comprising: removing additional portions of the first, second, and third layers; in response to removing additional portions of the first, second, and third layers, forming additional insulator material that directly contacts the first, second, and third layers; forming the insulator material between the bit line and the semiconductor layer in response to forming the insulator material that directly contacts the semiconductor layer.

Example 1a

A system comprising: a substrate; first, second, and third word lines; first, second, and third layers, wherein the first layer is between the substrate and the first word line, the second layer is between the first and second word lines, and the third layer is between the second and third word lines; first, second, and third portions of a material, wherein the first portion of the material is between the first word line and the first layer, the second portion of the material is between the second word line and the second layer, and the third portion of the material is between the third word line and the third layer; a monolithic semiconductor layer directly contacting the first, second, and third portions of the material; a bit line having a long axis and a short axis; wherein the first layer includes a metal, the second layer includes the metal, and the third layer includes the metal; wherein the material includes lead, zirconium, and titanium; wherein (a) a first plane, parallel to the short axis, intersects the first layer, the semiconductor layer, and the bit line; (b) a second plane, parallel to the short axis, intersects the second layer, the semiconductor layer, and the bit line; and (c) a third plane, parallel to the short axis, intersects the third layer, the semiconductor layer, and the bit line.

Example 1a

A system comprising: a substrate; first, second, and third word lines; first, second, and third layers, wherein the first layer is between the substrate and the first word line, the second layer is between the first and second word lines, and the third layer is between the second and third word lines; first, second, and third portions of a material, wherein the first portion of the material is between the first word line and the first layer, the second portion of the material is between the second word line and the second layer, and the third portion of the material is between the third word line and the third layer; a monolithic semiconductor layer on the first, second, and third portions of the material; a bit line having a long axis and a short axis; wherein the first layer includes a metal, the second layer includes the metal, and the third layer includes the metal; wherein the material includes lead, zirconium, and titanium; wherein (a) a first plane, parallel to the short axis, intersects the first layer, the semiconductor layer, and the bit line; (b) a second plane, parallel to the short axis, intersects the second layer, the semiconductor layer, and the bit line; and (c) a third plane, parallel to the short axis, intersects the third layer, the semiconductor layer, and the bit line.

For instance, a thin interfacial oxide may be between the monolithic semiconductor layer and the first, second, and third portions of the material. However, in other embodiments the monolithic semiconductor layer directly contacts the first, second, and third portions of the material.

Example 2a

The system of claim 1 comprising a NOR logic gate, wherein: the NOR logic gate includes the first, second, and third portions of the material; and the NOR logic gate includes the semiconductor layer.

Example 3a

The system of claim 2 comprising: a first axis that is parallel to the long axis, the first axis intersecting the bit line; a second axis that is parallel to the long axis, the second axis intersecting the first, second, and third word lines and the first, second, and third portions of the material; a third axis, parallel to the long axis, that intersects the first, second, and third layers; wherein the second axis does not intersect any of the first, second, or third layers.

Example 4a

The system of claim 3 wherein the third axis intersects the first, second, and third word lines and the first, second, and third portions of the material.

Example 5a

The system of claim 4 wherein the second axis intersects the semiconductor layer.

Example 6a

The system of claim 4 comprising a switching device, wherein: the switching device includes a source, a channel, and a drain; the source includes the semiconductor layer; the channel includes the semiconductor layer; the drain includes the semiconductor layer; a gate corresponding to the channel includes a portion of the first word line; a source contact corresponding to the source includes a portion of the first layer; a drain contact corresponding to the drain includes a portion of the bit line.

Example 7a

The system of claim 6 comprising an additional switching device, wherein: the switching device includes an additional source, an additional channel, and an additional drain; the additional source includes the semiconductor layer; the additional channel includes the semiconductor layer; the additional drain includes the semiconductor layer; an additional gate corresponding to the additional channel includes a portion of the second word line; an additional source contact corresponding to the additional source includes a portion of the second layer; an additional drain contact corresponding to the additional drain includes an additional portion of the bit line; wherein the second axis intersects the switching device and the additional switching device; wherein the switching device and the additional switching device are coupled to the bit line in parallel with each other.

Example 8a

The system of claim 6 comprising first and second memory cells, wherein: the first memory cell includes the switching device; the second memory cell does not include the first switching device; the first and second memory cells are included in random access memory (RAM); the first memory cell is addressable independently of the second memory cell.

Example 9a

The system of claim 6 comprising: a first insulator material between the first layer and the first portion of the material, the first insulator material including at least one of oxygen or nitrogen; a second insulator material between the second layer and the second portion of the material, the second insulator material including at least one of oxygen or nitrogen; and a third insulator material between the third layer and the third portion of the material, the third insulator material including at least one of oxygen or nitrogen; the third axis intersects the first, second, and third insulator materials.

Example 10a

The system of claim 9 comprising a fourth axis, parallel to the long axis, wherein: the fourth axis intersects: (a) the first, second, and third word lines, (b) the first, second, and third portions of the materials, and (c) the first, second, and third insulator materials; the fourth axis does not intersect any of the first, second, or third layers.

Example 11a

The system of claim 10 wherein the fourth axis intersects the semiconductor layer.

Example 12a

The system of claim 11 comprising: an additional first insulator material including at least one of oxygen or nitrogen, the additional first insulator material: (a)(i) being between the first word line and the substrate, and (a)(ii) being between the semiconductor layer and the bit line; an additional second insulator material including at least one of oxygen or nitrogen, the additional second insulator material: (a)(i) being between the first and second word lines, and (a)(ii) being between the semiconductor layer and the bit line; an additional third insulator material including at least one of oxygen or nitrogen, the additional third insulator material: (a)(i) being between the second and third word lines, and (a)(ii) being between the semiconductor layer and the bit line.

Example 13a

The system of claim 2 comprising: an integrated circuit; a memory comprising the NOR logic gate; and a package housing that includes the integrated circuit and the memory.

Example 14a

The system of claim 13 wherein the integrated circuit comprises a field programmable gate array (FPGA).

Example 15a

The system of claim 13 comprising: a radiofrequency receiver; and a chassis; wherein the chassis includes the radiofrequency receiver and the package.

Example 16a

The system of claim 2 comprising: a processor; a processor memory cache corresponding to the processor; wherein the processor memory cache includes the NOR logic gate.

Example 17a

The system of claim 2 comprising random access memory (RAM) that includes the NOR logic gate.

Example 18a

The system of claim 2 wherein the semiconductor layer includes a continuous portion of the semiconductor layer that extends, uninterrupted, from the first layer to the third word line.

Example 19a

The system of claim 2 wherein: the metal includes a first metal; the first word line includes an additional metal; the second word line includes the additional metal; the third word line includes the additional metal; the additional metal includes a second metal unequal to the first metal.

Example 20a

A system comprising: first, second, and third word lines; first, second, and third layers including a metal, wherein: (a) the first word line is between the first and second layers, (b) the second layer is between the first and second word lines; and (c) the third layer is between the second and third word lines; first, second, and third portions of ferroelectric material, wherein the first portion of ferroelectric material is between the first word line and the first layer, the second portion of ferroelectric material is between the second word line and the second layer, and the third portion of ferroelectric material is between the third word line and the third layer; a continuous semiconductor layer directly contacting the first, second, and third portions of ferroelectric material, wherein the semiconductor layer includes a portion of the semiconductor layer that extends, uninterrupted, from the first layer to the third word line; a bit line having a long axis and a short axis; wherein (a) a first plane, parallel to the short axis, intersects the first layer, the bit line, and the semiconductor layer; (b) a second plane, parallel to the long axis, intersects the first, second, and third word lines and the first, second, and third portions of ferroelectric material but does not intersect any of the first, second, or third layers; and (c) a third plane, parallel to the long axis, intersects the first, second, and third layers.

Example 21a

The system of claim 20 comprising a NOR logic gate, wherein the NOR logic gate includes the first, second, and third portions of ferroelectric material and the semiconductor layer.

Example 22a

The system of claim 20 wherein: the ferroelectric material includes oxygen; the ferroelectric material includes at least one of hafnium, zirconium, barium, titanium, lead, and combinations thereof.

Example 23a

A method comprising: providing a substrate; forming a stack on the substrate, the stack comprising: (a)(i) first, second, and third layers including a first metal, (a)(ii) additional first, second, and third layers including a second metal, wherein the additional first layer is between the substrate and the first layer, the additional second layer is between the first and second layers; and the additional third layer is between the second and third layers; (a)(iii) first, second, and third materials including a ferroelectric material, wherein the first material is between the first layer and the additional first layer, the second material is between the second layer and the additional second layer, and the third material is between the third layer and the additional third layer; removing portions of: (b)(i) the first, second, and third layers, (b)(ii) the additional first, second, and third layers, and the (b)(iii) first, second, and third materials; removing additional portions of the additional first, second, and third layers; in response to removing additional portions of the additional first, second, and third layers, forming a continuous semiconductor layer that directly contacts the first, second, and third materials; forming an insulator material that directly contacts the semiconductor layer; removing a portion of the insulator material; in response to removing a portion of the insulator material, forming a metal line.

Example 24a

The method of claim 23 comprising: forming first, second, and third word lines from the first, second, and third layers; forming a bit line from the metal line; wherein the semiconductor layer is included in a NOR logic gate; wherein the NOR logic gate is included in a memory; wherein (a) a first plane, parallel to a short axis of the bit line, intersects the first layer, the bit line, and the semiconductor layer; (b) a second plane, parallel to a long axis of the bit line, intersects the first, second, and third word lines and the first, second, and third materials but does not intersect any of the additional first, second, or third layers; and (c) a third plane, parallel to the long axis, intersects the additional first, second, and third layers.

Example 25a

The method of claim 24 comprising: removing additional portions of the first, second, and third layers; in response to removing additional portions of the first, second, and third layers, forming additional insulator material that directly contacts the first, second, and third layers; forming the insulator material between the bit line and the semiconductor layer in response to forming the insulator material that directly contacts the semiconductor layer.

Example 1b

A system comprising: a substrate; first, second, and third word lines; first, second, and third layers, wherein the first layer is between the substrate and the first word line, the second layer is between the first and second word lines, and the third layer is between the second and third word lines; first, second, and third portions of a material, wherein the first portion of the material is between the first word line and the first layer, the second portion of the material is between the second word line and the second layer, and the third portion of the material is between the third word line and the third layer; a monolithic semiconductor layer on the first, second, and third portions of the material; a bit line having a long axis and a short axis; wherein the first layer includes a metal, the second layer includes the metal, and the third layer includes the metal; wherein the material includes oxygen and at least one of hafnium, silicon, yttrium, zirconium, barium, titanium, lead, or combinations thereof;
wherein (a) a first plane, parallel to the short axis, intersects the first layer, the semiconductor layer, and the bit line; (b) a second plane, parallel to the short axis, intersects the second layer, the semiconductor layer, and the bit line; and (c) a third plane, parallel to the short axis, intersects the third layer, the semiconductor layer, and the bit line.

Example 2b

The system of example 1b comprising a NOR logic gate, wherein: the NOR logic gate includes the first, second, and third portions of the material; and the NOR logic gate includes the semiconductor layer.

Example 3b

The system according to any of examples 1b-2b comprising: a first axis that is parallel to the long axis, the first axis intersecting the first, second, and third word lines and the first, second, and third portions of the material; a second axis that is parallel to the long axis, the second axis intersecting the first, second, and third layers; wherein the first axis does not intersect any of the first, second, or third layers.

Example 4b

The system of example 3b wherein the second axis intersects the first, second, and third word lines and the first, second, and third portions of the material.

Example 5b

The system according to any of examples 3b-4b wherein the first axis intersects the semiconductor layer.

Example 6b

The according to any of examples 1b-5b comprising a switching device, wherein: the switching device includes a source, a channel, and a drain; the source includes the semiconductor layer; the channel includes the semiconductor layer; the drain includes the semiconductor layer; a gate corresponding to the channel, the gate including a portion of the first word line; a source contact corresponding to the source, the source contact including a portion of the first layer; a drain contact corresponding to the drain, the drain contact including a portion of the bit line.

Another version of Example 6b. The according to any of examples 1b-5b comprising a means for switching, wherein: the means for switching includes first node and a second node; the first node includes the semiconductor layer; the second node includes the semiconductor layer; a first contact corresponding to the first node, the first contact including a portion of the first word line; a second contact corresponding to the second node, the second contact including a portion of the first layer.

Example 7b

The system according to any of examples 3b-6b comprising an additional switching device, wherein: the additional switching device includes an additional source, an additional channel, and an additional drain; the additional source includes the semiconductor layer; the additional channel includes the semiconductor layer; the additional drain includes the semiconductor layer; an additional gate corresponding to the additional channel, the additional gate including a portion of the second word line; an additional source contact corresponding to the additional source, the additional source contact including a portion of the second layer; an additional drain contact corresponding to the additional drain, the additional drain contact including an additional portion of the bit line; wherein the first axis intersects the switching device and the additional switching device; wherein the switching device and the additional switching device are coupled to the bit line in parallel with each other.

Example 8b

The system according to any of examples 6b-7b comprising first and second memory cells, wherein: the first memory cell includes the switching device; the second memory cell does not include the switching device; the first and second memory cells are included in random access memory (RAM); the first memory cell is addressable independently of the second memory cell.

Example 9b

The system according to any of examples 3b-8b comprising: a first insulator material between the first layer and the first portion of the material, the first insulator material including at least one of oxygen, nitrogen, or carbon; a second insulator material between the second layer and the second portion of the material, the second insulator material including at least one of oxygen, nitrogen, or carbon; and a third insulator material between the third layer and the third portion of the material, the third insulator material including at least one of oxygen, nitrogen, or carbon; the second axis intersects the first, second, and third insulator materials.

Example 10b

The system of example 9b comprising a third axis, parallel to the long axis, wherein: the third axis intersects: (a) the first, second, and third word lines, (b) the first, second, and third portions of the materials, and (c) the first, second, and third insulator materials; the third axis does not intersect any of the first, second, or third layers.

Example 11b

The system of example 10b wherein the third axis intersects the semiconductor layer.

Example 12b

The system according to any of examples 9b-11b comprising: an additional first insulator material including at least one of oxygen, nitrogen, or carbon, the additional first insulator material: (a)(i) being between the first word line and the substrate, and (a)(ii) being between the semiconductor layer and the bit line; an additional second insulator material including at least one of oxygen, nitrogen, or carbon, the additional second insulator material: (a)(i) being between the first and second word lines, and (a)(ii) being between the semiconductor layer and the bit line; an additional third insulator material including at least one of oxygen, nitrogen, or carbon, the additional third insulator material: (a)(i) being between the second and third word lines, and (a)(ii) being between the semiconductor layer and the bit line.

Example 13b

The system according to any of examples 2b-12b comprising: an integrated circuit on a first die; a memory on a second die, the memory comprising the NOR logic gate; and the first and second die on a package substrate.

Example 14b

The system of example 13b wherein the integrated circuit comprises a field programmable gate array (FPGA).

Example 15b

The system of example 13b comprising: a radiofrequency receiver; and a chassis; wherein the chassis includes the radiofrequency receiver and the package substrate.

Example 16b

The system according to any of examples 2b-12b comprising: a processor; a processor memory cache corresponding to the processor; wherein the processor memory cache includes the NOR logic gate.

Example 17b

The system according to any examples 2b-12b comprising random access memory (RAM) that includes the NOR logic gate.

Example 18b

The system according to any of examples 1b-17b wherein the semiconductor layer includes a continuous portion of the semiconductor layer that extends, uninterrupted, from the first layer to the third word line.

Example 19b

The system according to any of examples 1b-18b wherein: the metal includes at least one of tungsten, copper, aluminum, tantalum, titanium, cobalt, or combinations thereof; the first word line includes an additional metal; the second word line includes the additional metal; the third word line includes the additional metal; the additional metal includes at least one of tungsten, copper, aluminum, tantalum, titanium, cobalt, or combinations thereof; the metal includes an element not included in the additional metal.

Example 20b

A system comprising: first, second, and third word lines; first, second, and third layers including a conductor material, wherein: (a) the first word line is between the first and second layers, (b) the second layer is between the first and second word lines; and (c) the third layer is between the second and third word lines; first, second, and third portions of ferroelectric material, wherein the first portion of ferroelectric material is between the first word line and the first layer, the second portion of ferroelectric material is between the second word line and the second layer, and the third portion of ferroelectric material is between the third word line and the third layer; a continuous semiconductor layer on the first, second, and third portions of ferroelectric material, wherein the semiconductor layer includes a portion of the semiconductor layer that extends, uninterrupted, from the first layer to the third word line; a bit line having a long axis and a short axis; wherein (a) a first plane, parallel to the short axis, intersects the first layer, the bit line, and the semiconductor layer; (b) a second plane, parallel to the long axis, intersects the first, second, and third word lines and the first, second, and third portions of ferroelectric material but does not intersect any of the first, second, or third layers; and (c) a third plane, parallel to the long axis, intersects the first, second, and third layers.

Example 21b

The system of claim 20 comprising a NOR logic gate, wherein the NOR logic gate includes the first, second, and third portions of ferroelectric material and the semiconductor layer.

Example 22b

The system according to any of examples 20b-21b wherein: the ferroelectric material includes oxygen; the ferroelectric material includes at least one of hafnium, zirconium, barium, titanium, lead, or combinations thereof; the conductor material includes at least one of polysilicon, amorphous silicon, tungsten, copper, aluminum, tantalum, titanium, cobalt, or combinations thereof; the first, second, and third word lines include an additional conductor material, the additional conductor material including at least one of polysilicon, amorphous silicon, tungsten, copper, aluminum, tantalum, titanium, cobalt, or combinations thereof; wherein the conductor material includes an element not included in the additional conductor material.

Example 23b

A method comprising: providing a substrate; forming a stack on the substrate, the stack comprising: (a)(i) first, second, and third layers including a first metal, (a)(ii) additional first, second, and third layers including a second metal, wherein the additional first layer is between the substrate and the first layer, the additional second layer is between the first and second layers; and the additional third layer is between the second and third layers; (a)(iii) first, second, and third materials including a ferroelectric material, wherein the first material is between the first layer and the additional first layer, the second material is between the second layer and the additional second layer, and the third material is between the third layer and the additional third layer; removing portions of: (b)(i) the first, second, and third layers, (b)(ii) the additional first, second, and third layers, and the (b)(iii) first, second, and third materials; removing additional portions of the additional first, second, and third layers; in response to removing additional portions of the additional first, second, and third layers, forming a continuous semiconductor layer that directly contacts the first, second, and third materials; forming an insulator material that directly contacts the semiconductor layer; removing a portion of the insulator material; in response to removing a portion of the insulator material, forming a metal line.

Example 24b

The method of example 23b comprising: forming first, second, and third word lines from the first, second, and third layers; forming a bit line from the metal line; wherein the semiconductor layer is included in a NOR logic gate; wherein the NOR logic gate is included in a memory; wherein (a) a first plane, parallel to a short axis of the bit line, intersects the first layer, the bit line, and the semiconductor layer; (b) a second plane, parallel to a long axis of the bit line, intersects the first, second, and third word lines and the first, second, and third materials but does not intersect any of the additional first, second, or third layers; and (c) a third plane, parallel to the long axis, intersects the additional first, second, and third layers.

Example 25b

The method of example 24b comprising: removing additional portions of the first, second, and third layers; in response to removing additional portions of the first, second, and third layers, forming additional insulator material that directly contacts the first, second, and third layers; forming the insulator material between the bit line and the semiconductor layer in response to forming the insulator material that directly contacts the semiconductor layer; wherein the first metal includes at least one of tungsten, copper, aluminum, tantalum, titanium, cobalt, or combinations thereof; wherein the second metal includes at least one of tungsten, copper, aluminum, tantalum, titanium, cobalt, or combinations thereof; wherein the first metal includes an element not included in the second metal.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A system comprising:
a substrate;
first, second, and third word lines;
first, second, and third layers, wherein the first layer is between the substrate and the first word line, the second layer is between the first and second word lines, and the third layer is between the second and third word lines;
first, second, and third portions of a material, wherein the first portion of the material is between the first word line and the first layer, the second portion of the material is between the second word line and the second layer, and the third portion of the material is between the third word line and the third layer;
a monolithic semiconductor layer on the first, second, and third portions of the material;
a bit line having a long axis and a short axis;
wherein the first layer includes a metal, the second layer includes the metal, and the third layer includes the metal;
wherein the material includes oxygen and at least one of hafnium, silicon, yttrium, zirconium, barium, titanium, lead, or combinations thereof;
wherein (a) a first plane, parallel to the short axis, intersects the first layer, the semiconductor layer, and the bit line; (b) a second plane, parallel to the short axis, intersects the second layer, the semiconductor layer, and the bit line; and (c) a third plane, parallel to the short axis, intersects the third layer, the semiconductor layer, and the bit line.

2. The system of claim 1 comprising a NOR logic gate, wherein:
the NOR logic gate includes the first, second, and third portions of the material; and
the NOR logic gate includes the semiconductor layer.

3. The system of claim 2 comprising:
a first axis that is parallel to the long axis, the first axis intersecting the first, second, and third word lines and the first, second, and third portions of the material;
a second axis that is parallel to the long axis, the second axis intersecting the first, second, and third layers;
wherein the first axis does not intersect any of the first, second, or third layers.

4. The system of claim 3 wherein the second axis intersects the first, second, and third word lines and the first, second, and third portions of the material.

5. The system of claim 4 wherein the first axis intersects the semiconductor layer.

6. The system of claim 4 comprising a switching device, wherein:
the switching device includes a source, a channel, and a drain;
the source includes the semiconductor layer;
the channel includes the semiconductor layer;
the drain includes the semiconductor layer;
the system comprises:
a gate corresponding to the channel, the gate including a portion of the first word line;
a source contact corresponding to the source, the source contact including a portion of the first layer;
a drain contact corresponding to the drain, the drain contact including a portion of the bit line.

7. The system of claim 6 comprising an additional switching device, wherein:
the additional switching device includes an additional source, an additional channel, and an additional drain;
the additional source includes the semiconductor layer;
the additional channel includes the semiconductor layer;
the additional drain includes the semiconductor layer;
the system comprises:
an additional gate corresponding to the additional channel, the additional gate including a portion of the second word line;
an additional source contact corresponding to the additional source, the additional source contact including a portion of the second layer;
an additional drain contact corresponding to the additional drain, the additional drain contact including an additional portion of the bit line;
wherein the first axis intersects the switching device and the additional switching device;
wherein the switching device and the additional switching device are coupled to the bit line in parallel with each other.

8. The system of claim 6 comprising first and second memory cells, wherein:
the first memory cell includes the switching device;
the second memory cell does not include the switching device;
the first and second memory cells are included in random access memory (RAM);
the first memory cell is addressable independently of the second memory cell.

9. The system of claim 6 comprising:
a first insulator material between the first layer and the first portion of the material, the first insulator material including at least one of oxygen, nitrogen, carbon, or combinations thereof;
a second insulator material between the second layer and the second portion of the material, the second insulator material including at least one of oxygen, nitrogen, carbon, or combinations thereof; and
a third insulator material between the third layer and the third portion of the material, the third insulator material including at least one of oxygen, nitrogen, carbon, or combinations thereof;
the second axis intersects the first, second, and third insulator materials.

10. The system of claim 9 comprising a third axis, parallel to the long axis, wherein:
the third axis intersects: (a) the first, second, and third word lines, (b) the first, second, and third portions of the materials, and (c) the first, second, and third insulator materials;
the third axis does not intersect any of the first, second, or third layers.

11. The system of claim 10 wherein the third axis intersects the semiconductor layer.

12. The system of claim 11 comprising:
an additional first insulator material including at least one of oxygen, nitrogen, carbon, or combinations thereof, the additional first insulator material: (a)(i) being between the first word line and the substrate, and (a)(ii) being between the semiconductor layer and the bit line;
an additional second insulator material including at least one of oxygen, nitrogen, carbon, or combinations thereof, the additional second insulator material: (a)(i) being between the first and second word lines, and (a)(ii) being between the semiconductor layer and the bit line;
an additional third insulator material including at least one of oxygen, nitrogen, carbon, or combinations thereof, the additional third insulator material: (a)(i) being between the second and third word lines, and (a)(ii) being between the semiconductor layer and the bit line.

13. The system of claim 2 comprising:
an integrated circuit on a first die;
a memory on a second die, the memory comprising the NOR logic gate; and
the first and second die on a package substrate.

14. The system of claim 13 wherein the integrated circuit comprises a field programmable gate array (FPGA).

15. The system of claim 13 comprising:
a radiofrequency receiver; and
a chassis;

wherein the chassis includes the radiofrequency receiver and the package substrate.

16. The system of claim 2 comprising:
a processor;
a processor memory cache corresponding to the processor;
wherein the processor memory cache includes the NOR logic gate.

17. The system of claim 2 comprising random access memory (RAM) that includes the NOR logic gate.

18. The system of claim 2 wherein the semiconductor layer includes a continuous portion of the semiconductor layer that extends, uninterrupted, from the first layer to the third word line.

19. The system of claim 2 wherein:
the metal includes at least one of tungsten, copper, aluminum, tantalum, titanium, cobalt, or combinations thereof;
the first word line includes an additional metal;
the second word line includes the additional metal;
the third word line includes the additional metal;
the additional metal includes at least one of tungsten, copper, aluminum, tantalum, titanium, cobalt, or combinations thereof;
the metal includes an element not included in the additional metal.

20. A system comprising:
first, second, and third word lines;
first, second, and third layers including a conductor material, wherein: (a) the first word line is between the first and second layers, (b) the second layer is between the first and second word lines; and (c) the third layer is between the second and third word lines;
first, second, and third portions of ferroelectric material, wherein the first portion of ferroelectric material is between the first word line and the first layer, the second portion of ferroelectric material is between the second word line and the second layer, and the third portion of ferroelectric material is between the third word line and the third layer;
a continuous semiconductor layer on the first, second, and third portions of ferroelectric material, wherein the semiconductor layer includes a portion of the semiconductor layer that extends, uninterrupted, from the first layer to the third word line;
a bit line having a long axis and a short axis;
wherein (a) a first plane, parallel to the short axis, intersects the first layer, the bit line, and the semiconductor layer; (b) a second plane, parallel to the long axis, intersects the first, second, and third word lines and the first, second, and third portions of ferroelectric material but does not intersect any of the first, second, or third layers; and (c) a third plane, parallel to the long axis, intersects the first, second, and third layers.

21. The system of claim 20 comprising a NOR logic gate, wherein the NOR logic gate includes the first, second, and third portions of ferroelectric material and the semiconductor layer.

22. The system of claim 20 wherein:
the ferroelectric material includes oxygen;
the ferroelectric material includes at least one of hafnium, zirconium, barium, titanium, lead, or combinations thereof;
the conductor material includes at least one of polysilicon, amorphous silicon, tungsten, copper, aluminum, tantalum, titanium, cobalt, or combinations thereof;
the first, second, and third word lines include an additional conductor material, the additional conductor material including at least one of polysilicon, amorphous silicon, tungsten, copper, aluminum, tantalum, titanium, cobalt, or combinations thereof;
wherein the conductor material includes an element not included in the additional conductor material.

* * * * *